(12) United States Patent
Rein et al.

(10) Patent No.: US 12,062,885 B2
(45) Date of Patent: Aug. 13, 2024

(54) LIGHT MODULE AND A METHOD FOR ITS OPERATION

(71) Applicant: trinamiX GmbH, Ludwigshafen am Rhein (DE)

(72) Inventors: Benjamin Rein, Ludwigshafen (DE); Nils Berner, Ludwigshafen (DE); Philipp Nils Raith, Ludwigshafen (DE)

(73) Assignee: TRINAMIX GMBH, Ludwigshafen am Rhein (DE)

( * ) Notice: Subject to any disclaimer, the term of this patent is extended or adjusted under 35 U.S.C. 154(b) by 324 days.

(21) Appl. No.: 17/628,756

(22) PCT Filed: Jul. 24, 2020

(86) PCT No.: PCT/EP2020/070944
§ 371 (c)(1),
(2) Date: Jan. 20, 2022

(87) PCT Pub. No.: WO2021/013984
PCT Pub. Date: Jan. 28, 2021

(65) Prior Publication Data
US 2022/0285914 A1    Sep. 8, 2022

(30) Foreign Application Priority Data
Jul. 25, 2019 (EP) .................................. 19188430

(51) Int. Cl.
*H01S 5/068* (2006.01)
*F21V 9/08* (2018.01)
(Continued)

(52) U.S. Cl.
CPC ............ *H01S 5/06825* (2013.01); *F21V 9/08* (2013.01); *H01S 5/005* (2013.01); *F21Y 2115/30* (2016.08)

(58) Field of Classification Search
None
See application file for complete search history.

(56) References Cited

U.S. PATENT DOCUMENTS 7,137,132 B2   11/2006   Sogawa et al.
7,742,514 B1   6/2010    Sanders
(Continued)

FOREIGN PATENT DOCUMENTS

| EP | 1724886 A1 | 11/2006 |
| JP | H06123851 A | 5/1994 |
| JP | 2018189939 A | 11/2018 |

OTHER PUBLICATIONS

International Search Report and Written Opinion for corresponding PCT/EP2020/070944 mailed Oct. 16, 2020, 7 Pages.

*Primary Examiner* — Wilson Lee
(74) *Attorney, Agent, or Firm* — Armstrong Teasdale LLP (57) ABSTRACT

Disclosed herein is a light module and a method for operating the light module. The light module includes a light source; an electronic circuit for driving the light source; where the electronic circuit includes a current source, where the current source is designated for generating and controlling a control current for driving the light source, and a protection controller, where the protection controller is designated for interrupting the control current to the light source in an event in which the current source fails. The light module and the related method address an eye-safe operation of the light module, specifically for a laser light source included by the light module to achieve compliance to laser safety class 1.

12 Claims, 1 Drawing Sheet

(51) Int. Cl.
*H01S 5/00* (2006.01)
*F21Y 115/30* (2016.01)

(56) References Cited

U.S. PATENT DOCUMENTS

| | | | |
|---|---|---|---|
| 9,564,291 B1* | 2/2017 | Own | C23C 14/24 |
| 10,361,052 B1* | 7/2019 | Rodriguez Salinas | H01H 11/045 |
| 2005/0140345 A1* | 6/2005 | Iwabuki | H05B 45/48 323/268 |
| 2006/0187209 A1* | 8/2006 | Lai | G06F 3/03543 345/166 |
| 2010/0123895 A1* | 5/2010 | Reiner | G01S 7/497 372/9 |
| 2016/0081171 A1* | 3/2016 | Ichikawa | H05B 47/25 315/77 |
| 2017/0045203 A1* | 2/2017 | Mao | G02B 27/30 |
| 2017/0094257 A1* | 3/2017 | Zhang | H02J 7/00 |
| 2017/0123237 A1* | 5/2017 | DeMuth | B22F 12/44 |
| 2017/0224990 A1* | 8/2017 | Goldwasser | A61N 1/0476 |
| 2019/0154871 A1* | 5/2019 | Leduc | G08B 13/196 |
| 2019/0170877 A1 | 6/2019 | Wang et al. | |
| 2019/0346537 A1* | 11/2019 | Krelboim | G01S 17/18 |
| 2021/0263426 A1* | 8/2021 | Liang | G03F 7/70525 |

* cited by examiner

LIGHT MODULE AND A METHOD FOR ITS OPERATION

CROSS-REFERENCE TO RELATED APPLICATIONS

This application is a U.S. National Phase Application of International Patent Application No. PCT/EP2020/070944, filed Jul. 24, 2020, which claims priority to European Patent Application No. 19188430.3, filed Jul. 25, 2019, the entire contents of which are hereby incorporated by reference herein.

FIELD OF THE INVENTION

The present invention refers to a light module and a method for operating the light module. In particular, the light module and the related method address an eye-safe operation of the light module, specifically for a laser light source comprised by the light module to achieve compliance to laser safety class 1.

PRIOR ART

Laser modules which are used for 3D imaging, such as for a projection of dot patterns, typically, comprise a laser diode which is designated for generating laser radiation. The laser diode as used herein is, in general, an edge emitting laser diode which comprises a semiconducting wafer having a surface and two cleaved edges, wherein the laser radiation being generated by applying a driving electrical current to the wafer propagates in a direction along the surface of the wafer until it is reflected or coupled out at one of the cleaved edges.

To allow an eye-safe operation, the laser module, specifically the laser diode comprised by the laser module, has to achieve compliance to laser safety class 1. As defined in DIN EN 60825-1:2014, laser safety class 1 requires that a corresponding laser module is safe under all conditions of normal use, specifically that a maximum permissible laser output power which may expose the eye of a user cannot be exceeded when the user views the laser module with naked eye or uses a magnifying optical device, such as a microscope or a telescope having a small aperture. Similar considerations are applicable to the eye-safe operation of other kinds of laser modules. For light emitting diodes, DIN EN 62471 can be applied in a similar fashion.

For regulating the electrical current through the laser diode, a single electronic element which is designated for this purpose is, typically, comprised by known laser modules having laser diodes, such as edge emitting laser diodes. However, in case of a malfunction of the single electronic element, the laser output power generated by the laser diode can easily exceed the maximum permissible laser output power according to laser safety class 1.

In addition, the laser module can, further, comprise a diffractive optical element in a beam path after the laser radiation has left the laser diode. Herein, the diffractive optical element comprises a delicate diffractive structure which is, typically, introduced into a polymeric material, in particular into a polycarbonate. Further, the diffractive optical element may be carried by a mount provided by the laser module. However, a mechanical impact may easily result in a breaking out of the diffractive optical element from the mount due to limited mechanical stability of the polymeric material. As a result of the loss of the diffractive optical element from the laser module, the power of the laser which is directly transmitted without a diffractive optical element may easily exceed the maximum permissible laser output power according to laser safety class 1.

Further, heat exposure may easily result in a deformation of the diffractive structure of the diffractive optical element due to limited heat resilience of the polymeric material. As a result of the deformation of the diffractive structure, the power of a share of the laser radiation which corresponds to a direct transmission through the diffractive optical element (zero order) may be increased, such that the maximum permissible laser output power according to laser safety class 1 can easily be exceeded here.

Therefore, in an improved arrangement, an additional photo diode having an additional circuit can be employed, wherein the additional photo diode may be designed for receiving a partition of the emitted laser radiation, and wherein the additional circuit may be designated, on one hand, for determining the power of the emitted laser radiation and, on the other hand, for switching off the electrical current driving the edge emitting laser diode, if desired. However, this kind of arrangement is rather complex since it requires a further optical element in form of the additional photo diode as well as an additional circuit comprising an amplifier circuit having a comparator for the additional photo diode.

In a further improved arrangement, a timer is, additionally, used in connection with placing the additional photo diode in the beam path after the diffractive optical element, which allows determining an efficiency of the diffractive optical element during the operation of the laser module. However, this kind of arrangement does not allow, simultaneously, determining a power output of the edge emitting laser diode. Consequently, a lower efficiency of the diffractive optical element could be compensated by a higher power output of the laser diode, thus easily leading to an exceeding of the maximum permissible laser output power according to laser safety class 1. A further disadvantage is the placing of the additional photo diode in the beam path after the diffractive optical element, which results in in an increased size of the laser module which is not tolerable for mobile applications, such integrating the laser module into a mobile communication device, such as a smartphone or a tablet.

In a further improved arrangement, a presence of the diffractive optical element could be determined. For this purpose, an electrically conducting material could be applied to one or more edges of the diffractive optical element. Together with corresponding electrically conducting contacts at the mount carrying the diffractive optical element a switch can be generated hereby, which may indicate an error in an event in which no electrical contact between the diffractive optical element and the mount may be provided. However, this kind of arrangement requires equipping the diffractive optical element with an electrically conducting edge. As a further disadvantage, this kind of arrangement does not allow determining a deformation of the diffractive optical element after a heat exposure.

EP 1 724 886 A1 discloses a controller for controlling a transceiver having a laser transmitter and a photodiode receiver. The controller includes memory for storing information related to the transceiver, and analog to digital conversion circuitry for receiving a plurality of analog signals from the laser transmitter and photodiode receiver, converting the received analog signals into digital values, and storing the digital values in predefined locations within the memory. Comparison logic compares one or more of these digital values with limit values, generates flag values based on the comparisons, and stores the flag values in predefined locations within the memory. Control circuitry in the controller controls the operation of the laser transmitter in accordance with one or more values stored in the memory. A serial interface is provided to enable a host device to read from and write to locations within the memory. Excluding a small number of binary input and output signals, all control and monitoring functions of the transceiver are mapped to unique memory mapped locations within the controller. A plurality of the control functions and a plurality of the monitoring functions of the controller are exercised by a host computer by accessing corresponding memory mapped locations within the controller.

U.S. Pat. No. 7,742,514 B1 discloses an apparatus including a diode laser, a current source inter-connected with the diode laser, and four limiting circuits. The first limiting circuit limits peak current flowing to an anode connection of the diode laser. The second limiting circuit limits peak current flowing from a cathode connection of the diode laser, wherein the first and second limiting circuits are independent from each other. The third limiting circuit limits average current flowing through the diode laser. Finally, the fourth limiting circuit limits average current flowing through the diode laser, wherein the third and fourth limiting circuits are independent from each other.

US 2019/170877 A1 discloses an eye-safe laser triangulation measurement system, including a laser transmitter, an optical projection apparatus, a laser beam capturing unit, a cooperation unit, and an image processing apparatus. The laser transmitter is configured to generate point pulse laser of a pulse laser beam. The optical projection apparatus is disposed at a front end of the laser transmitter, and is configured to convert the point pulse laser into a line laser. The laser beam capturing unit is configured to capture reflected light obtained by the line laser at a target position to obtain a laser image. The cooperation unit is configured to control on and off of the laser transmitter, and control capture of the laser beam capturing unit. The image processing apparatus is configured to perform 3D modeling on the laser image to obtain a distance to the target position.

Problem to be Solved

It is, therefore, an object of the present invention to provide a light module and a method for operating the light module which may at least partially overcome the above-mentioned technical disadvantages and shortcomings of known light modules and methods for operating the light modules.

In particular, it is an object of the present invention to provide a simple and easily mountable light module as well as a low-cost method for operating the light module. Specifically, it would be desirable to provide a light module, in particular a laser module, which shows an improved eye-safe operation, especially by an improved compliance of the laser module to laser safety class 1, without being required to use an additional photo diode and to apply an electrically conducting material to edges of a diffractive optical element. Furthermore, the light module should be capable of working in a similar fashion with of further laser light sources or other kinds of slight sources, such as light emitting diodes.

SUMMARY OF THE INVENTION

This problem is solved by a light module and a method for operating the light module with the features of the independent claims. Preferred embodiments which might be realized in an isolated fashion or in any arbitrary combination are listed in the dependent claims.

As used in the following, the terms "have", "comprise" or "include" or any arbitrary grammatical variations thereof are used in a non-exclusive way. Thus, these terms may both refer to a situation in which, besides the feature introduced by these terms, no further features are present in the entity described in this context and to a situation in which one or more further features are present. As an example, the expressions "A has B", "A comprises B" and "A includes B" may both refer to a situation in which, besides B, no other element is present in A (i.e. a situation in which A solely and exclusively consists of B) and to a situation in which, besides B, one or more further elements are present in entity A, such as element C, elements C and D or even further elements.

Further, as used in the following, the terms "preferably", "more preferably", "particularly", "more particularly", "specifically", "more specifically" or similar terms are used in conjunction with optional features, without restricting alternative possibilities. Thus, features introduced by these terms are optional features and are not intended to restrict the scope of the claims in any way. The invention may, as the skilled person will recognize, be performed by using alternative features. Similarly, features introduced by "in an embodiment of the invention" or similar expressions are intended to be optional features, without any restriction regarding alternative embodiments of the invention, without any restriction regarding the scope of the invention and without any restriction regarding the possibility of combining the features introduced in such a way with other optional or non-optional features of the invention.

In a first aspect of the present invention, a light module is disclosed. Accordingly, the light module comprises
  a light source;
  an electronic circuit for driving the light source; wherein the electronic circuit comprises
    a current source, wherein the current source is designated for generating and controlling a control current for driving the light source, and
    a protection controller, wherein the protection controller is designated for interrupting the control current to the light source in an event in which the current source fails.

As generally used, a "light module" refers to an apparatus which comprises a light source, wherein the term "light source" relates to a device which is adapted for generating desired light radiation. In particular, the light source may comprise a laser light source, a superluminescence diode (SLED), or a light-emitting diode (LED). However, other kinds of light sources may also be feasible.

The term "laser light source" refers to a device which is designated for generating desired laser radiation. Herein, the laser radiation is generated in a process of optical amplification based on a stimulated emission of electromagnetic radiation, either as a continuous wave (cw) or in form of short laser pulses, wherein the laser pulses may, specifically, be defined by a pulse repetition rate, a pulse duration, an average output power, and a peak power. Specifically, the laser light source may be selected from at least one of a laser diose, a distributed feedback laser diode (DFB laser diode), or a vertical cavity surface emitting laser (VCSEL). However, other kinds of laser light sources may also be feasible.

Especially for being able to be used in 3D imaging, in particular for a projection of dot patterns, the laser diode can, preferably, be used as the laser light source in the laser module according to the present invention. As generally used, the term "laser diode" refers to a device which comprises a semiconducting wafer having a surface and two cleaved edges, wherein the laser radiation is generated by applying a driving electrical current to the wafer. Preferably, an edge emitting laser diode can be used for the present invention. Herein, the term "edge emitting laser diode" refers to a laser diose in which the generated laser radiation propagates in a direction along the surface of the wafer until it is reflected or coupled out at one of the cleaved edges. However, other kinds of laser diodes may also be feasible.

Further, the terms "superluminescence diode" or "SLED" relate to a semiconducting device which is designated as an edge-emitting light source. For this purpose, the superluminescence diode, typically, comprises an electrically driven p-n junction which, upon being biased in a forward direction by an injection current, is configured to generate the desired amplified spontaneous emission over a wide range of wavelengths, wherein a peak wavelength and a peak intensity, generally, depend, on the semiconducting material and on a level of the injection current.

Further, the terms "light-emitting diode" or "LED" refer to a semiconducting device which is designated to emits light upon a current flow through the semiconducting material, whereby photons are generated upon recombination of electrons provided by the current with holes as comprised by the semiconductor. Herein, an energy of the photons is, in particular, determined by the band gap of the semiconducting material.

The light module may, especially, comprise a housing which may, in particular, be arranged for accommodating the light source, the electronic circuit, and, if applicable, one or more further optional components, specifically, a diffractive optical element and a corresponding mount as described below in more detail.

The light which is emitted by the light source is provided in form of a light beam, specifically a laser beam. As used herein, the term "light beam" generally refers an amount of light propagating along a beam path in more or less the same direction. Specifically, the beam may be or may comprise a bundle of light rays and/or a common wave front of light. The light beam may be a monochromatic light beam having precisely one wavelength A or may be a light beam having a plurality of wavelengths or a wavelength spectrum, wherein a central wavelength of the spectrum and/or a wavelength of a characteristic peak within the spectrum may be selected as the wavelength A of the light beam.

As generally used, a "beam path" is a path along which the light beam or a part thereof may propagate. Thus, preferably, the light beam within the light module may propagate along a single beam path, wherein the single beam path may, preferably, be a straight beam path. As an alternative, the beam path may have one or more deflections, such as a folded beam path, a branched beam path, a rectangular beam path or a Z-shaped beam path. Alternatively, at least two beam paths may be used for the propagation of the light beam, wherein the at least two beam paths may be generated by an appropriate optical element, such as a beam-splitting element. The term "beam-splitting element" refers to an optical element which is adapted for dividing the light beam, into at least two portions having identical intensities or different intensities. Further, the light beam may propagate along each beam path or partial beam path once or repeatedly, unidirectionally or bidirectionally.

As further used herein, a "beam profile" of the light beam, generally, refers to a property of the light beam which may be displayed in a 2D spatially resolved intensity plot of the light beam at a given location along the beam path. Herein, the light beam may have a Gaussian beam profile as known to the skilled person. However, other types of beam profiles may also be feasible. Further, the light beam may be guided through a transfer device, wherein the transfer device is adapted for modifying the beam profile of the light beam. As generally used, the term "transfer device" generally refers to an optical element or a combination of at least two individual optical elements being adapted for influencing the beam profile of the incident light beam by altering one or more of a beam shape, a beam width or a widening angle of the light beam in a well-defined fashion. In order to be able to perform such an alteration, the transfer device may be or comprise at least one of: a lens, such as a collimating lens; diffractive optical element; a focusing mirror; a reflector; or a prism. However, other kinds of transfer devices may also be feasible.

Further according to the present invention, the light module comprises an electronic circuit which is designated for driving the light source. As generally used, the term "driving a light source" refers to a mode of operation of the light by applying an electrical quantity, in particular an electrical voltage or, preferably, an electrical current, to the light source in a fashion that a well-defined light radiation is generated, wherein at least one parameter of the light radiation, such as the intensity of the light radiation, depends in an unambiguous manner, such as in a monotonous fashion, on a value of the electrical quantity.

For this purpose, the electronic circuit comprises a current source. As generally used, the term "current source" refers to an electronic device which is designated for generating and controlling a control current, in particular the control current for driving the light source. Consequently, the term "control current" refers to an electrical current which is designed for controlling the light source as comprised here by the light module. For this purpose, a supply current or, preferably, a supply voltage may be used which is applied to the current source in the fashion that the desired well-defined light radiation is generated. In a particularly preferred embodiment, the current source may be a constant current source. As generally used, the term "constant current source" refers to a current source which, additionally, comprises a thermal compensation. As a result thereof, the current which is generated by the current source only slightly varies with temperature. In a further preferred embodiment, the current source may, in addition, comprise a current delimiter. In a further preferred embodiment, the current source may be designated for generating and controlling the control current for driving the light source upon application of a trigger signal, such as an external trigger signal, to the current source. As generally used, the term "trigger signal" refers to an electric impulse which is configured for initiating an operation, here an operation of the current source and, consequently, of the light source. As a result, thereof, the light source may only be in operation upon activating the trigger signal. However, other kinds of current sources and related embodiments thereof may also be feasible.

Further according to the present invention, the electronic circuit comprises a protection controller. As generally used, the term "protection controller" relates to an electronic device which is designated for interrupting a voltage or, preferably, a current which is applied to a further electronic element or device in a predefined event. With particular respect to the present invention, the protection controller may be designated for interrupting the supply current or, preferably supply voltage being applied to the current source, thereby interrupting the control current to the light source, in an event in which the current source fails. As generally used, the term "fails" refers to an operation mode of the current source in which the current source does no longer react to an input provided by the supply current or supply voltage in a usual manner, such that an output of the current source can no longer be provided in a controlled fashion. As a result of interrupting the control current to the light source, the light source stops emitting the light radiation, thereby keeping the light module in an eye-safe operation mode, in particular by avoiding that the laser output power as generated by the laser diode would exceed the maximum permissible laser output power according to laser safety class 1. For other light sources, such as a superluminescence diode or a light emitting diode, a comparable result can be achieved in this fashion. In a particularly preferred embodiment, the protection controller can be an overcurrent protection controller or, preferably, an overvoltage protection controller. In particular, the protection controller can be an overcurrent protection controller which may be arranged between the supply voltage and the constant current source, thereby achieving a protection of the constant current source from overvoltage. However, other kinds of protection controllers and related embodiments thereof may also be feasible.

In a particularly preferred embodiment of the present invention, the light module may further comprise at least one, preferably exactly one, diffractive optical element. As generally used, the term "diffractive optical element" refers to a transfer device as defined above which is designated for influencing the beam profile of the incident light beam by altering the beam shape using optical diffraction. For this purpose, the diffractive optical element comprises a structure which is designated for optically diffracting in incident light beam, wherein the diffractive optical element may be selected from an optical grating, a diffractive microstructure, a Fresnel lens, or a metasurface. As generally used, the term "optical grating" refers to an optical element having a periodic structure, in particular in form of parallel ridges or grooves being introduced into a transparent substrate, which is designed for diffracting an incident light beam depending on a width and a spacing of the diffractive structure of the optical grating. As further generally used, the term "diffractive microstructure" refers to an optical element comprising a plurality of micro-machined complex micro-protrusions and/or microgrooves. As further generally used, the term "Fresnel lens" refers to a composite compact lens which is, compared to a lens of conventional design, provided in a mass and/or volume reduced fashion, especially for allowing a construction of a lens having a large aperture and a short focal length. As further generally used, the term "metasurface" refers to an artificial sheet material having a sub-wavelength thickness and being designed for modulating a behavior of the incident light beam through boundary conditions, wherein the metasurface can be either structured or unstructured with subwavelength-scaled patterns in at least one horizontal dimension. However, other kinds of and embodiments for diffractive optical elements may also be feasible.

In a preferred embodiment, the light module may further comprise a mount which is designated for accommodating the at least one, preferably the exactly one, diffractive optical element. As generally used, the term "mount" refers to a part of the light module, in particular of the housing of the light module, which is designed for receiving and maintaining the diffractive optical element, preferably in a safe and stable position, especially with respect to a location and orientation of the incident light beam as provided by the light source. By way of example, the housing of the light module may comprise an annular recess which may be dimensioned for accommodating the diffractive optical element which can, preferably, be provided in form of a disc-shaped substrate carrying the diffractive structure. In order to achieve and maintain a proper and stable positioning of the diffractive optical element which respect to the incident light beam, the diffractive optical element, in particular an edge of the disc-shaped substrate which carries the diffractive structure, can be attached to the mount by using an adhesive, wherein the adhesive may be designated for fastening at least one edge of the diffractive optical element to the mount, specifically to the annular recess being dimensioned for receiving and maintaining the diffractive optical element.

In a particularly preferred embodiment of the present invention, the at least one, preferably the exactly one, diffractive optical element may, further, be attached to the mount by a fastening element, wherein the fastening element may, in particular, assume a form of a ring. Herein, the term "ring" refers to a flat ring-shaped body which is dimensioned to a size of the diffractive optical element, thereby, concurrently, providing an additional fastening of the diffractive optical while, still, allowing the light beam to traverse the diffractive optical element without being obstructed by the ring. In particular, the ring-shaped body may be attached to the mount, such as by using one or more of a screw, a clamp, or an adhesive, thereby fastening the diffractive optical element between the ring and the mount. Herein, the ring may comprise a further polymeric material which is, particularly, suited for its purpose due to its low weight, durability, and non-disturbance of the beam path of the light. In particular, the further polymeric material may, preferably, be identical with the polymeric material of the diffractive optical element and/or, be selected from a polycarbonate (PC), a polyoxymethylene (POM), an acrylic polymer, such as poly(methyl methacrylate) (PMMA); or a cyclic olefin copolymer (COC), such as TOPAS®. For further details, reference may be made to the exemplary embodiments as described below. However, still, other kinds of fastening elements and methods for applying the fastening element, specifically to the housing of the light module, may also be conceivable.

In further a particularly preferred embodiment of the present invention, the electronic circuit may further comprise a temperature control designated for controlling the temperature of the at least one, preferably the exactly one, diffractive optical element. As generally used, the term "temperature control" refers to an electronic device which is designed for providing a trigger signal in form of an electric impulse for initiating an operation, here an operation of the current source and, consequently, of the light source, in an event in which a temperature of a controlled device, here of the diffractive optical element, may be equal to or may exceed a predefined threshold temperature. In particular, the temperature control may be designated for interrupting the control current to the light source as described above and below in more detail in an event in which a temperature of the diffractive optical element may exceed a predefined threshold temperature which may be related to the diffractive optical element. Preferably, the temperature control may be or comprise a temperature control element selected from at least one of a temperature fuse, specifically a non-reversible temperature fuse; a thermistor; or a thermocouple.

In accordance with the present invention, the threshold temperature may, preferably, be related to a structural property of the diffractive optical element, in particular to a temperature which may be well below a deformation temperature at which a deformation of the diffractive structure of the diffractive optical element may commence due to limited heat resilience of the polymeric material. By avoiding such a deformation of the diffractive structure, the power of a share of the radiation which corresponds to a direct transmission through the diffractive optical element (zero order) could be maintained, in particular, such that the maximum permissible laser output power stay within the requirements to laser safety class 1. By way of example, the threshold temperature may, preferably, be selected from a temperature which may be below a softening temperature of a polymeric material comprising the diffractive structure, wherein the polymeric material may, in particular, be selected from a polycarbonate; an acrylic polymer, such as poly(methyl methacrylate) (PMMA); or a cyclic olefin copolymer (COC), such as TOPAS®. Especially, the threshold temperature may, preferably, be 5° C. to 50° C., in particular 10° C. to 25° C., below the softening temperature of the polymeric material.

In order to achieve an appropriate estimation of the temperature, the temperature control element, in particular the temperature fuse, may, preferably, be located in a vicinity to the diffractive optical element, in particular in an adjacent manner with respect to the diffractive optical element. As generally used, the term "vicinity" with respect to the diffractive optical element refers to a location at allows an appropriate estimation of the temperature of the diffractive optical element is still possible. Further, the terms "adjacent" and "adjacently" relate to a location which directly adjoins the diffractive optical element. For further details, reference may be made to the exemplary embodiments as described below.

In a further aspect of the present invention, a method for operating a light module is disclosed. The method comprises the following method steps, which may, preferably, be performed in the given order. Further, any or all of the method steps may be performed simultaneously and/or overlapping in time. Further, any or all of the method steps may be performed repeatedly. In addition, the method may comprise further steps. The method comprises the following method steps:

providing a light module as described elsewhere herein;
providing a supply voltage or a supply current to a current source which is designated for generating and controlling a control current for driving a light source; and
generating a control current for driving the light source unless the control current to the light source is interrupted by a protection controller in an event in which the current source fails.

As already indicated above in more detail, the term "fails" refers to an operation mode of the current source in which the current source does no longer react to an input provided by the supply current or supply voltage in a usual manner, such that an output of the current source can no longer be provided in a controlled fashion.

In a further aspect, the present invention refers to computer program product which comprises executable instructions for performing at least one of the methods steps as described elsewhere herein. For this purpose, the light module may comprise or be connected to, in a wire-bound or a wireless fashion, a processing device which may, specifically, be adapted for this purpose. As an example, the processing device may be comprised by an embedded or a remote computer system, by which the executable instructions for controlling the light module could be performed. As an alternative, the processing device could be comprised by a mobile communication device, such as a smartphone or a tablet, having a mobile operating system which is designated for facilitating a use of software, including an application ("app") for performing the executable instructions for controlling the light module, as well as internet and multimedia functionalities.

For further details concerning the method for operating the light module and the computer program product, reference may be made to the description of the light module according to one or more of the embodiments listed above or listed in further detail below.

In a further aspect of the present invention, the light module and a method for operating the light module according to the present invention may be used in a plurality of application purposes, such as one or more of the purposes disclosed in further detail in the following, preferably in one or more of the following applications selected from at least one of: manufacturing, imaging, quality control, face recognition, bin-picking, or presence detection. However, further applications may also be conceivable.

Summarizing the above-mentioned findings, the following embodiments are preferred within the present invention:

Embodiment 1. A light module, comprising:
a light source;
an electronic circuit for driving the light source; wherein the electronic circuit comprises
a current source, wherein the current source is designated for generating and controlling a control current for driving the light source, and
a protection controller, wherein the protection controller is designated for interrupting the control current to the light source in an event in which the current source fails.

Embodiment 2. The light module according to the preceding Embodiment, wherein the light module is a laser module.

Embodiment 3. The light module according to any one of the preceding Embodiments, wherein the light source is or comprises a laser light source, a superluminescence diode, or a light-emitting diode.

Embodiment 4. The light module according to the preceding Embodiment, wherein the laser light source is selected from at least one of a laser diose, a distributed feedback laser diode, or a vertical cavity surface emitting laser.

Embodiment 5. The light module according to any one of the preceding Embodiments, wherein the laser diode is an edge emitting laser diode.

Embodiment 6. The light module according to any one of the preceding Embodiments, wherein the current source is a constant current source.

Embodiment 7. The light module according to the preceding Embodiment, wherein the constant current source is designated for generating the control current for driving the light source by using a supply voltage.

Embodiment 8. The light module according to any one of the two preceding Embodiments, wherein the protection controller is an overcurrent protection controller which is arranged between the supply voltage and the constant current source for the protection of the constant current source from overvoltage.

Embodiment 9. The light module according to any one of the three preceding Embodiments, wherein the current source is designated for generating and controlling the control current for driving the light source upon application of a trigger signal to the current source.

Embodiment 10. The light module according to any one of the preceding Embodiments, wherein the term fails refers to an operation mode of the current source in which the current source does no longer react to an input.

Embodiment 11. The light module according to the preceding Embodiment, wherein the input is provided by a supply current or a supply voltage.

Embodiment 12. The light module according to any one of the preceding Embodiments, further comprising a housing, wherein the housing is arranged for accommodating at least the light source and the electronic circuit.

Embodiment 13. The light module according to any one of the preceding Embodiments, further comprising a diffractive optical element.

Embodiment 14. The light module according to the preceding Embodiment, wherein the diffractive optical element is selected from at an optical grating, a diffractive microstructure, a Fresnel lens, or a metasurface.

Embodiment 15. The light module according to any one of the two preceding Embodiments, wherein the electronic circuit further comprises a temperature control for the diffractive optical element.

Embodiment 16. The light module according to the preceding Embodiment, wherein the temperature control is designated for interrupting the control current to the light source upon exceedance of a temperature of the diffractive optical element.

Embodiment 17. The light module according to any one of the four preceding Embodiments, wherein the temperature control is selected from at least one of a temperature fuse, a thermistor; or a thermocouple.

Embodiment 18. The light module according to the preceding Embodiment, wherein the temperature fuse is a non-reversible the temperature fuse.

Embodiment 19. The light module according to any one of the preceding Embodiments, wherein the temperature fuse is located in a vicinity of the diffractive optical element.

Embodiment 20. The light module according to any one of the five preceding Embodiments, wherein the temperature control element is located in an adjacent manner with respect to the diffractive optical element.

Embodiment 21. The light module according to any one of the eight preceding Embodiments, wherein the diffractive optical element comprises a polymeric material.

Embodiment 22. The light module according to the preceding Embodiment, wherein the polymeric material is selected from a polycarbonate, an acrylic polymer, or a cyclic olefin copolymer.

Embodiment 23. The light module according to any one of the ten preceding Embodiments, further comprising a mount for accommodating the diffractive optical element.

Embodiment 24. The light module according to the preceding Embodiment, wherein the mount is comprised by a housing of the light module.

Embodiment 25. The light module according to any one of the two preceding Embodiments, wherein the diffractive optical element is attached to the mount by an adhesive.

Embodiment 26. The light module according to the preceding Embodiment, wherein the adhesive fastens at least one edge of the diffractive optical element to the mount.

Embodiment 27. The light module according to any one of the four preceding Embodiments, wherein the diffractive optical element is further attached to the mount by a fastening element.

Embodiment 28. The light module according to any one of the four preceding Embodiments, wherein the fastening element is or comprises a ring.

Embodiment 29. The light module according to the preceding Embodiment, wherein the ring is attached to the mount, thereby fastening the diffractive optical element between the ring and the mount.

Embodiment 30. The light module according to the preceding Embodiment, wherein the ring is attached to the mount by using at least one of a screw, a clamp, or an adhesive.

Embodiment 31. The light module according to any one of the three preceding Embodiments, wherein the ring comprises a further polymeric material.

Embodiment 32. The light module according to the preceding Embodiment, wherein the further polymeric material is selected from at least one of a polycarbonate, a polyoxymethylene, an acrylic polymer a polycarbonate, or a cyclic olefin copolymer.

Embodiment 33. The light module according to any one of the preceding Embodiments, wherein the light module achieves compliance to laser safety class 1.

Embodiment 34. A method for operating a light module, the method comprising the following steps:
  providing a light module as described elsewhere herein;
  providing a supply voltage or a supply current to a current source which is designated for generating and controlling a control current for driving a light source; and
  generating a control current for driving the light source unless the control current to the light source is interrupted by a protection controller in an event in which the current source fails.

Embodiment 35. The method according to the preceding Embodiment, wherein the light module is a laser module.

Embodiment 36. The method according to any one of the two preceding Embodiments, wherein the light source is or comprises a laser light source, a superluminescence diode, or a light-emitting diode.

Embodiment 37. The method according to the preceding Embodiment, wherein the laser light source is selected from at least one of a laser diose, a distributed feedback laser diode, or a vertical cavity surface emitting laser.

Embodiment 38. The method according to any one of the four preceding Embodiments, wherein the term fails refers to an operation mode of the current source in which the current source does no longer react to an input.

Embodiment 39. The method according to the preceding Embodiment, wherein the input is provided by a supply current or a supply voltage.

Embodiment 40. The method according to any one of the six preceding Embodiments, wherein the control current for driving the light source is generated unless the control current to the light source is interrupted by a temperature control for a diffractive optical element upon exceedance of a temperature of the diffractive optical element.

Embodiment 41. The method according to the preceding Embodiment, wherein the temperature of the diffractive optical element is equal to or exceeds a predefined threshold temperature.

Embodiment 42. The method according to the preceding Embodiment, wherein the threshold temperature is selected from a temperature below a softening temperature of a polymeric material comprised by the diffractive optical element.

Embodiment 43. The method according to the preceding Embodiment, wherein the threshold temperature is 5° C. to 50° C., in particular 10° C. to 25° C., below the softening temperature of the polymeric material.

Embodiment 44. A use of a light module according to any one of the preceding Embodiments related to the light module in one or more of the applications selected from the group consisting of manufacturing, imaging, quality control, face recognition, bin-picking, and presence detection.

BRIEF DESCRIPTION OF THE FIGURES

Further optional details and features of the invention are evident from the description of preferred exemplary embodiments which follows in conjunction with the dependent claims. In this context, the particular features may be implemented alone or in any reasonable combination. The invention is not restricted to the exemplary embodiments. The exemplary embodiments are shown schematically in the figures. Identical reference numerals in the individual figures refer to identical elements or elements with identical function, or elements which correspond to one another with regard to their functions.

In the Figures.

EXEMPLARY EMBODIMENTS

Figure 1:
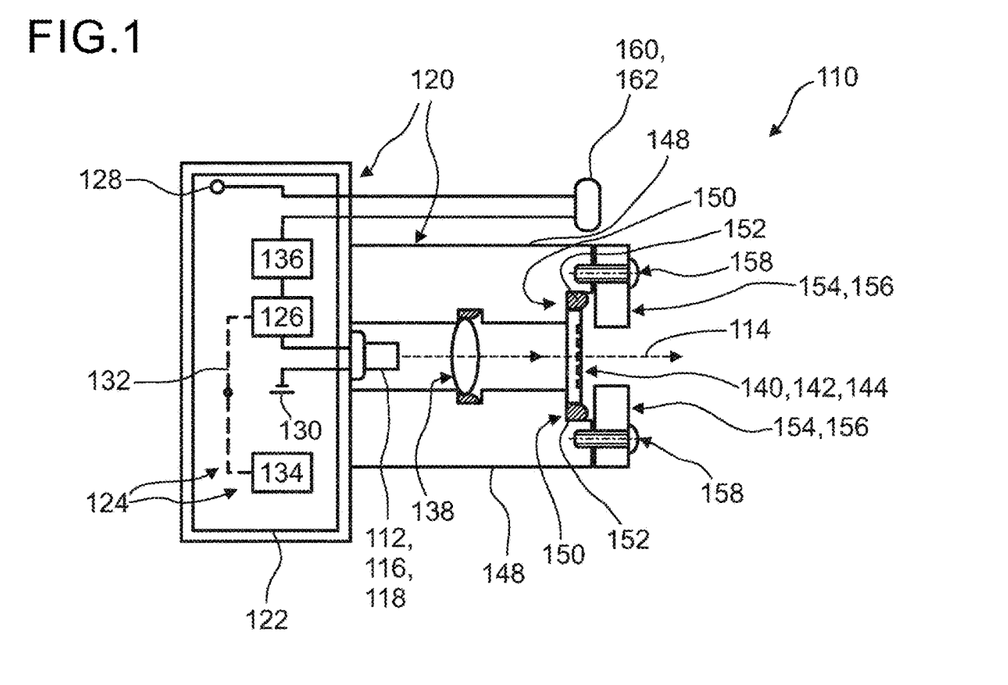
FIG. 1 illustrates a preferred embodiment of a light module according to the present invention in a schematic sectional view.
Figure 2:
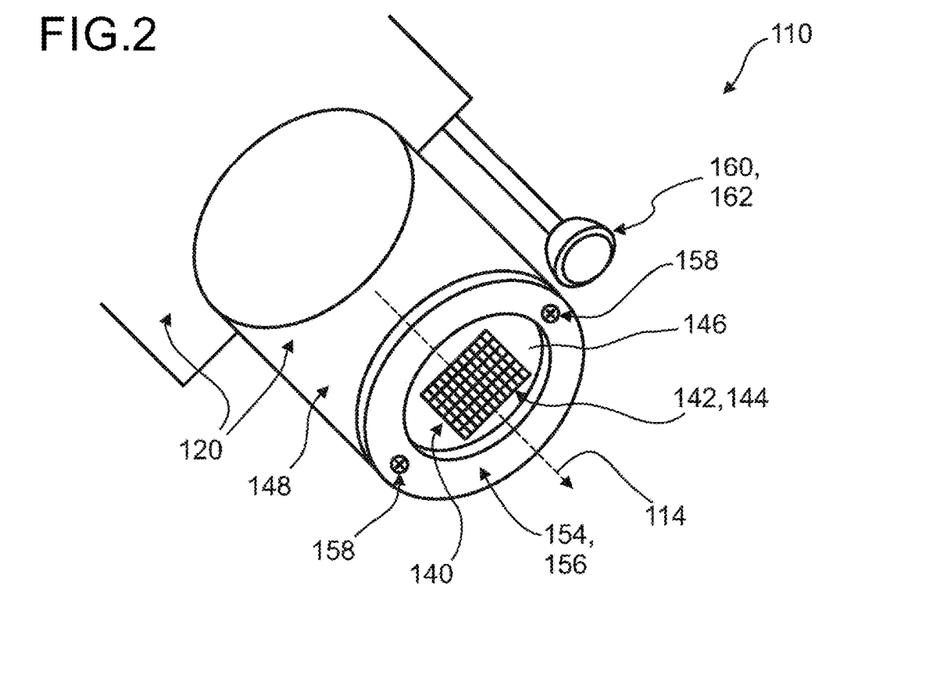
FIG. 2 illustrates the preferred embodiment of the light module according to FIG. 1 in an aerial view.

FIGS. 1 and 2 each illustrates a preferred embodiment of a light module 110 according to the present invention. Herein, FIG. 1A shows a schematic sectional view of the light module 110 while FIG. 1B depicts an aerial view of the light module 110.

The light module 110 comprises a light source 112 which is adapted for generating desired light radiation which comprises an amount of light having a beam profile and propagating along a beam path in more or less the same direction. In particular, the light module 110 may be a laser module comprising a laser light source which is configured for generating the desired light radiation in form of laser radiation 114. Especially for being able to be used in 3D imaging, in particular for a projection of dot patterns, a laser diode 116, preferably, an edge emitting laser diode 118 can be used as the laser light source 112. However, other kinds of light sources 112, such as other kinds of laser diodes 116 or other laser light sources, such as a distributed feedback laser diode (DFB laser diode), or a vertical cavity surface emitting laser (VCSEL), may also be feasible. Alternatively, a superluminescence diode (SLED) or a light-emitting diode (LED) may also be used as the light source 112. In the following, the laser diode 116 is, however, used as exemplary light source 112, thereby not intending to limit the scope of the present invention.

As schematically depicted in FIGS. 1 and 2, the light module 110 comprises a housing 120 which is arranged for accommodating the laser diode 116, an electronic circuit board 122, and further components which are described below in more detail. As further shown in FIG. 1, the electronic circuit board 122 of the light module 110 comprises an electronic circuit 124 which is designed for driving the laser diode 116. For this purpose, the electronic circuit 124 comprises a current source 126 which is designated for generating and controlling a control current for driving the laser diode 116, wherein a further connection of the laser diode 116 is connected to ground 130, which may be connected to the housing 120 of the light module 110 (not depicted here). For this purpose, a supply voltage 128 can be applied to the current source 126 in a fashion that the desired well-defined laser radiation 114 is generated. As particularly preferred, the current source 126 may be a constant current source which, additionally, comprises a thermal compensation. Further, the current source may, in addition, comprise a current delimiter.

By way of example, a laser diode pulse driver iC-NZN produced by is Haus, information about which is available via www.ichaus.com, can be used as the current source 126 for the present invention. This type of current source 126 allows CW operation of the laser diode 116 and spike-free switching with defined current pulses up to 155 MHz. The optical output power of the laser diode 116 is set-up by means of an external resistor. For high pulse frequencies, the device can be switched into controlled burst mode, wherein a previously settled operating point can be maintained throughout the burst phase. When a current limit is reached, an overcurrent is signaled while the current is limited to a pre-set value but the current controller is not shut down. Further, this type of current source 126 has an additional current limitation which prevents the current source 126 from overpowering the laser diode 116. However, other kinds currents sources 126 may also be feasible, in particular a discrete circuit based on an operational amplifier IC.

As further illustrated in FIG. 1, the current source 126 may be designated for generating and controlling the control current for driving the laser diode 116 upon application of a trigger signal 132, such as an external trigger signal, which may be generated by a trigger electronics 134, to the current source 126. As a result thereof, the laser diode 116 may only be in operation upon activating of the trigger signal 132.

Further, the electronic circuit 124 comprises a protection controller 136 which is designated for interrupting the supply voltage 128 which is applied to the current source 126, whereby the control current to the laser diode 116 is interrupted in an event in which the current source 126 fails. Thus, in an operation mode in which the current source 126 does no longer provide a reasonable control current in the desired controlled fashion, the protection controller 136 interrupts any current to the laser diode 116. Consequently, the laser diode 116 stops emitting the laser radiation 114, thereby keeping the light module 110 in an eye-safe operation mode by avoiding that the laser output power being generated by the laser diode 116 would exceed the maximum permissible laser output power according to laser safety class 1. In the depicted preferred embodiment, the protection controller 136 is an overcurrent protection controller which is arranged between the supply voltage 128 and the constant current source 126, thereby achieving a desired protection of the constant current source 126 from overvoltage.

By way of example, protection controller LTC4361-1 or LTC4361-2 produced by Analog Devices, Inc., information about which is available via www.analog.com, can be used here as the protection controller. This kind of protection controller 136 can safeguard 2.5 V to 5.5 V systems from an overvoltage provided by the input supply 128. It is designed for portable devices with multiple power supply options selected from wall adaptors, car battery adaptors, or USB ports. In most applications, this kind of protection controller 136 can provide protection from transients up to 80 V without requiring transient voltage suppressors or other external components. It features a soft shutdown controlled pin and, following an overvoltage condition, automatically restarts with a start-up delay. After an overcurrent fault, this kind of protection controller 136 can remain off or, alternatively, automatically restart after a delay period. However, other kinds of protection controllers 136 and related embodiments thereof may also be feasible, in particular a TPS2552 or a TPS2553 from Texas Instruments Inc., as a current limiter, information about which is available via www.ti.com/lit/ug/sluu339/sluu339.pdf.

As further depicted in FIG. 1, the laser radiation 114, after being emitted from the laser diode 116, passes a collimating lens 138, which is adapted for influencing the beam profile of the incident laser radiation 114 by decreasing a beam width and/or a widening angle of the laser beam in a well-defined fashion. However, further kinds of transfer devices, such a different lens, a focusing mirror, a reflector, or a prism, may also be feasible.

In the particularly preferred embodiment as shown in FIGS. 1 and 2, the light module 110 further comprises a diffractive optical element 140 which is designated for further influencing the beam profile of the laser radiation 114 beam by altering a beam shape using optical diffraction. As schematically depicted there, the diffractive optical element 140 comprises an optically diffractive structure 142 in a fashion of a two-dimensional optical grating 144 having a periodic structure, in particular in form of parallel ridges or grooves which are introduced into a transparent disc-shaped substrate 146, wherein a diffractive effect on the incident laser radiation 114 depends on a width and a spacing of the diffractive structure 142 of the optical grating 144. However, other kinds of embodiments for diffractive optical elements 140, such as described above in more detail, may also be feasible.

As further illustrated in the FIG. 1, the exemplary embodiment of the light module 110 as depicted there may comprise a mount 148 which is designated for accommodating the diffractive optical element 140. For this purpose, a part of the housing 120 of the light module 110 is designed for receiving and maintaining the diffractive optical element 140 in a safe and stable position, especially with respect to a location and orientation of the laser radiation 114 provided by the light source 112. In this exemplary embodiment, the housing 120 of the light module 110 comprises an annular recess 150 being dimensioned for accommodating the diffractive optical element 140 which is, as schematically depicted there, provided in the form of the disc-shaped substrate 146 carrying the diffractive structure 142. In order to achieve and maintain a proper and stable positioning of the diffractive optical element 140 which respect to the laser radiation 114, an edge of the disc-shaped substrate 146 is attached to the mount 148 by using an adhesive 152 which is designated for fastening the edge of the of the disc-shaped substrate 146 to the annular recess 150 which is, especially, dimensioned for receiving and maintaining the diffractive optical element 140.

In the exemplary embodiment of the light module 110 as shown in FIGS. 1 and 2, the diffractive optical element 140 is, further, attached to the mount 148 by a fastening element 154. As illustrated there, the fastening element 154 may, in particular, assume a form of a ring 156 having a flat ring-shaped body which is dimensioned to a size of the diffractive optical element 140 in a fashion that, concurrently, an additional fastening of the diffractive optical 140 is provided while the laser radiation 114 can, still, traverse the diffractive optical element 140 without being obstructed by the ring 156. In this exemplary embodiment, the ring 156 is attached to the mount 148 by two screws 158, whereby the diffractive optical element 140 is fastened between the ring 156 and the mount 148. Herein, the ring 156 may comprise a further polymeric material, preferably selected from at least one of a polycarbonate, a polyoxymethylene, an acrylic polymer, or a cyclic olefin copolymer, which is, particularly, suited for its purpose due to its low weight, durability, and non-disturbance of the laser radiation 114. However, other kinds and numbers of fastening elements 154 as well as manners of applying the fastening element 154 to the mount 148 may also be conceivable.

In the exemplary embodiment of the light module 110 as depicted in FIGS. 1 and 2, the electronic circuit 124 further comprises a temperature control element 160 which is designated for controlling the temperature of the diffractive optical element 140. Herein, the temperature control element 160 is a temperature fuse 162, specifically a non-reversible temperature fuse, which is designed for providing a trigger signal in form of an electric impulse for initiating an operation of the current source 126 and, consequently, of the laser diode 116. In an event in which a temperature of the diffractive optical element 140 may be equal to or may exceed a predefined threshold temperature, the temperature control element 160 may be designated for interrupting the control current to the laser diode 116 in a similar fashion as described above. By way of example, the temperature control element 160 may be a ESKA N2F, produced by Bürklin Electronics, information about which is available via www.buerklin.com/en/thermal-fuse/p/40g700, which has a threshold temperature of 102° C. As a further example, the temperature control element 160 may be a SEFUSE SF/E Series Thermal Fuse, produced by ATC Semitec Ltd., information about which is available via https://docs-apac.rs-online.com/webdocs/1546/0900766b81546f0c.pdf, which may have a threshold temperature of 73° C. to 240° C. Further, the temperature control element 160 may be a NEC/Schott SEFUSE thermal cutoff, such as an SM092A02A fuse, produced by Limitor GmbH, information about which is available via https://www.mantech.co.za/datasheets/products/SM %20092%20A0%202A-180616A.pdf, which has a threshold temperature of 76° C. to 187° C., such as 97° C. However, other kinds of temperature control elements 160, such as a thermistor or a thermocouple, may also be feasible.

Thus, the threshold temperature of the temperature control element 160 corresponds to a temperature which is well below a deformation temperature of the diffractive structure 142 of the diffractive optical element 140. As a result, by avoiding a deformation of the diffractive structure 142, the power of a share of the laser radiation 114 which corresponds to a direct transmission through the diffractive optical element (zero order) could be maintained, such that the maximum permissible laser output power stay within the requirements to laser safety class 1. As indicated above, the threshold temperature may, preferably, be 5° C. to 50° C., in particular 10° C. to 25° C., below the softening temperature of the polymeric material, such as a polycarbonate; an acrylic polymer, such as poly(methyl methacrylate) (PMMA); or a cyclic olefin copolymer (COC), such as TOPAS®, information about which is available via topas-.com/sites/default/files/PRODUCTS-E-13.06.19.pdf which is comprised by the disc-shaped substrate 146 carrying the sensitive diffractive structure 142 of the diffractive optical element 140.

In order to achieve an appropriate estimation of the temperature, the temperature control element 160, in particular the temperature fuse 162, may, as schematically depicted in FIGS. 1 and 2, preferably be located in a vicinity to the diffractive optical element 140, in particular in an adjacent manner with respect to the diffractive optical element 140.

LIST OF REFERENCE NUMBERS 110 light module
112 light source 114 laser radiation
116 laser diode
118 edge emitting laser diode
120 housing
122 electronic circuit board
124 electronic circuit
126 current source
128 supply voltage
130 ground
132 trigger signal
134 trigger electronics
136 protection controller
138 collimating lens
140 diffractive optical element
142 diffractive structure
144 optical grating
146 (disc-shaped) substrate
148 mount
150 annular recess
152 adhesive
154 fastening element
156 ring
158 screw
160 temperature control element
162 temperature fuse

The invention claimed is:

1. A light module, comprising
a light source; and
an electronic circuit for driving the light source; wherein the electronic circuit comprises
a current source, wherein the current source is designated for generating and controlling a control current for driving the light source, and
a protection controller, wherein the protection controller is designated for interrupting the control current to the light source in an event in which the current source fails, wherein the term fails refers to an operation mode of the current source in which the current source does no longer react to an input,
wherein the light module further comprises a diffractive optical element, and
wherein the electronic circuit further comprises a temperature control element for the diffractive optical element, wherein the temperature control element is designated for interrupting the control current to the light source upon exceedance of a temperature of the diffractive optical element.

2. The light module according to claim 1, wherein the current source is a constant current source, wherein the constant current source is designated for generating the control current for driving the light source by using a supply voltage, and wherein the protection controller is an overcurrent protection controller which is arranged between the supply voltage and the constant current source for the protection of the constant current source from overvoltage.

3. The light module according to claim 1, wherein the current source is designated for generating and controlling the control current for driving the light source upon application of a trigger signal to the current source.

4. The light module according to claim 1, wherein the temperature control element is or comprises at least one of a temperature fuse, a thermistor or a thermocouple.

5. The light module according to claim 4, wherein the temperature fuse is a non-reversible temperature fuse.

6. The light module according to claim 1, wherein the temperature control element is located adjacently to the diffractive optical element.

7. The light module according to claim 1, further comprising a mount for accommodating the diffractive optical element.

8. The light module according to claim 7, wherein the diffractive optical element is attached to the mount by an adhesive, wherein the adhesive fastens at least one edge of the diffractive optical element to the mount.

9. The light module according to claim 7, wherein the diffractive optical element is further attached to the mount by a ring, wherein the ring is attached to the mount, thereby fastening the diffractive optical element between the ring and the mount.

10. The light module according to claim 8, wherein the ring comprises a polymeric material.

11. The light module according to claim 1, wherein the light source is a laser diode.

12. A method for operating a light module, the method comprising the following steps:
providing a light module according to claim 1;
providing a supply voltage or a supply current to a current source which is designated for generating and controlling a control current for driving a light source; and
generating a control current for driving the light source unless the control current to the light source is interrupted by a protection controller in an event in which the current source fails, wherein the term fails refers to an operation mode of the current source in which the current source does no longer react to an input,
wherein the control current for driving the light source is generated unless the control current to the light source is interrupted by a temperature control element for a diffractive optical element upon exceedance of a temperature of the diffractive optical element.

* * * * *